United States Patent [19]

Prentakis

[11] Patent Number: 4,790,584

[45] Date of Patent: Dec. 13, 1988

[54] COMPLIANT LINK

[75] Inventor: Antonios E. Prentakis, Cambridge, Mass.

[73] Assignee: Teradyne, Inc., Boston, Mass.

[21] Appl. No.: 115,270

[22] Filed: Oct. 30, 1987

Related U.S. Application Data

[63] Continuation of Ser. No. 872,178, Jun. 9, 1986, abandoned.

[51] Int. Cl.[4] .................. H05K 3/30; B65G 47/40; B65H 9/10
[52] U.S. Cl. ........................... 294/1.1; 414/730; 414/781; 29/740
[58] Field of Search ............... 294/1.1, 64.1, 65, 65.5; 414/590, 737, 781, 784, 730; 269/319, 315; 29/737, 739, 740, 738, 743, 744, 721

[56] References Cited

U.S. PATENT DOCUMENTS

| | | | |
|---|---|---|---|
| 3,982,627 | 9/1976 | Isohota | 414/781 |
| 4,098,001 | 7/1978 | Watson | 33/169 |
| 4,404,741 | 9/1983 | Lebet et al. | 29/740 |
| 4,425,076 | 1/1984 | Colineau | 29/740 |
| 4,571,148 | 2/1986 | Drazen | 414/930 |

FOREIGN PATENT DOCUMENTS

| | | |
|---|---|---|
| 0121391 | 3/1984 | European Pat. Off. . |
| 0113145 | 11/1984 | European Pat. Off. . |
| 2121380 | 12/1983 | United Kingdom . |
| 2144711 | 3/1985 | United Kingdom . |
| 2152473 | 8/1985 | United Kingdom . |
| 8303217 | 8/1983 | World Int. Prop. O. . |

Primary Examiner—James B. Marbert

[57] ABSTRACT

Compliant linkage apparatus for providing, in a single stage, three degrees of freedom in a single plane, the apparatus comprising an upper plate, a lower plate under the upper plate, sliding means for allowing the upper and lower plates to slide relative to each other in X, Y, and theta, and orientation means for causing the plates to attract each other in a particular orientation to resiliently resist relative lateral and rotational displacements of the plates.

21 Claims, 1 Drawing Sheet

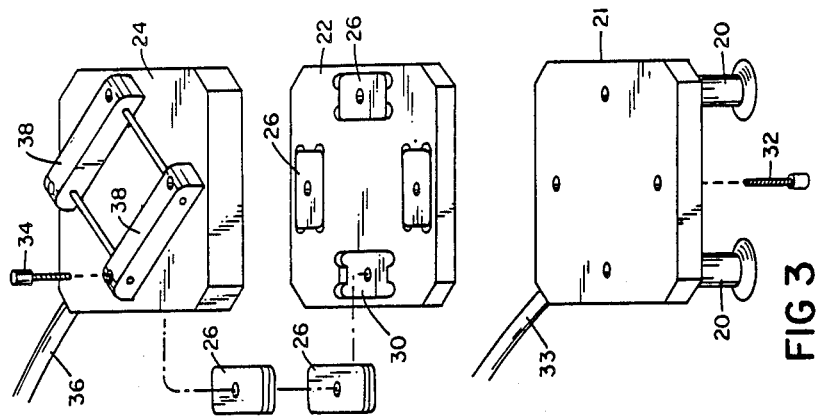
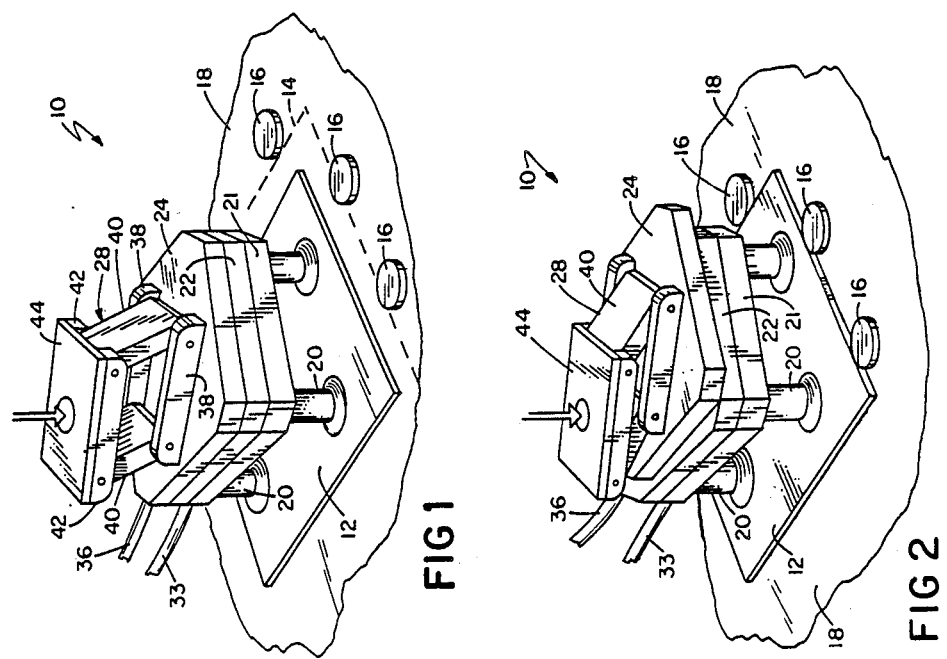

COMPLIANT LINK

This is a continuation of application Ser. No. 872,178, filed June 9, 1986, now abandoned.

FIELD OF THE INVENTION

The invention relates to a compliant linkage device which provides three degrees of freedom, e.g., one used in registering workpieces.

BACKGROUND OF THE INVENTION

In manufacturing processes involving generally flat plate-like workpieces, it is a standard practice to secure the workpiece in a defined location on a flat work surface such as a vacuum chuck by registering two orthogonal edges of the workpiece against three registration points defining a corner. This is the common practice, for example, in the hybrid circuits manufacturing process, wherein ceramic plates are used as substrates upon which circuitry is created by the silkscreening of conductive and resistive pastes. Subsequently, resistors within the circuitry are modified, usually by automatic laser trimming, to adjust their resistance to within a specified tolerance of the desired value. In addition, active electronic components are often incorporated within the circuit; the loading of these components is also generally done by automatic equipment. Repeatable registration of the workpiece relative to the workholders of the various machines in the production line is essential if expensive and time consuming alignment procedures for each workpiece are to be avoided.

Registration of the workpieces may be done manually or mechanically. Manual registration is extremely simple in concept: the operator places the workpiece on the work surface (e.g., vacuum chuck) and slides it into contact with the three registration points (usually tooling pins); the human hand has no difficulty ascertaining that the workpiece has made contact with all three registration points and that no more force or motion is required. Mechanical registration is necessary when the workpieces are to be loaded by automatic machines (e.g., "pick and place" robots) without operator intervention. When such a machine places a workpiece on the work surface, the workpiece will in general need to be translated in two axes (e.g., X and Y) and rotated through some angle (Theta) in order to make contact with the registration points. Mechanical registration has generally been accomplished by incorporating in the workholder of each process machine some form of gripping mechanism, typically including a pair of spring-loaded arms which push the workpiece into the registration corner from the variable position at which it was deposited by the loader. Such mechanisms work well when configured for a particular size and shape of workpiece, but their reliability can suffer when a variety of workpiece sizes must be accommodated; and they represent a certain level of complexity since they contain in general several moving parts.

SUMMARY OF THE INVENTION

I have discovered that a compliant linkage having three degrees of freedom in a single plane can be provided by a pair of plates which are free to slide relative to each other but which are provided with means to cause the plates to be attracted to each other in a particular orientation so as to resiliently resist relative lateral and rotational displacements of the plates.

In preferred embodiments magnetism is used to cause the plates to attract each other in the desired orientation; the plates are made of nonferrous material, and there are discrete magnets at corresponding locations on opposing surfaces of the upper and lower plates; and the relative sliding between the two plates is provided by an air cushion between them created by compressed air admitted into the interface of the plates through one or more orifices.

The preferred use for the compliant linkage is in apparatus for mechanically registering a flat workpiece on a flat work surface in a registration corner. A displacement mechanism providing displacement in a direction generally toward the corner is connected to the upper plate, and a workpiece holder is connected to the lower plate. The displacement mechanism causes displacement of the upper plate, lower plate, workpiece holder and workpiece toward the registration corner, and the plates are free to slide relative to each other in three degrees of freedom, against the forces of attraction, after the workpiece makes initial contact with the registration corner, permitting registration with the registration corner.

Preferably the displacement mechanism includes a parallelogram linkage connected to the upper plate so that downward motion, applied for example by a loader arm, of the upper member of the linkage toward the work surface is converted into horizontal motion along the work surface toward the registration corner. Thus, after the workpiece has been placed on the work surface, the continued downward motion of the loader arm causes collapsing of the linkage, and drives the workpiece toward the registration corner automatically.

Other features and advantages of the invention will be apparent from the following description of the preferred embodiment thereof, and from the claims.

PREFERRED EMBODIMENT

The preferred embodiment will now be described.

Drawings

FIG. 1 is a diagrammatic perspective view of workpiece registration apparatus according to the invention in one position.

FIG. 2 is a diagrammatic perspective view of the FIG. 1 apparatus showing the workpiece in a registered position.

FIG. 3 is an exploded perspective view showing the compliant linkage and workpiece holding components of the FIG. 1 apparatus.

Structure

Referring to FIG. 1, there is shown apparatus 10 for registering flat workpiece 12 (for example a PCB or ceramic substrate) into a position 14 of a registration corner defined by three registration points 16 on flat work surface 18. Device 10 includes vacuum engagement members 20 connected to vacuum plate 21, lower and upper plates 22, 24 (separated from each other slightly by pressurized air supplied between them and attracted to and resiliently aligned with one another by magnets 26, FIG. 3) and parallelogram linkage 28.

Referring to FIG. 3, it is seen that lower plate 21 has vacuum hose 33 connected to it for selectively applying vacuum to engagement members 20 to engage and disengage workpiece 12. Magnets 26 are secured in recesses 30 of lower plate 24 via epoxy adhesive. Magnets 26 are similarly secured in similar aligned recesses (not shown) in the lower surface of upper plate 24 and secured therein via epoxy adhesive. Four bolts 32 (only one shown) secure vacuum plate 21 to lower plate 22. Four bolts 34 (only one shown) secure the lower horizontal bars 38 of parallelogram linkage 28 to upper plate 24. The north poles of magnets 26 on plate 22 face the south poles of magnets 26 on plate 24. Upper plate 24 has pressurized air hose 36 connected to it and passages within plate 24 leading to a plurality of orifices in the lower surface of plate 24 to provide an air cushion between the plates.

Parallelogram linkage 28 includes a pair of arms 40 pivotally mounted at their bottom ends to bars 38 and at their upper ends to bars 42 secured to upper block 44, which is secured to the loader arm of a loading machine (e.g., a pick and place or other robot) providing downward motion of upper block 44 perpendicular to and toward work surface 18. The longitudinal axes of bars 38, 42 of parallelogram linkage 28 are at 45° angles with the edges of corner position 14 so that movement of plates 21, 22, 24 and workpiece 12 is in this direction after workpiece 12 contacts work surface 18. Magnets 26 are sufficiently strong to maintain attraction between plates 22, 24 even after there has been substantial (for example, about 1 cm) relative lateral motion in any direction between them.

Operation

When the loader arm (not shown) on which upper block 44 of linkage 28 is attached descends, a point is reached in the motion when workpiece 12 first makes contact with work surface 18. At this point linkage 28 is still in the open (i.e., arms 40 nearly vertical) position; lower and upper plates 22, 24 are aligned with each other, and workpiece 12 is at some position removed from registration points 16. As the loader arm (and upper block 44 of linkage 28) continue to descend, linkage 28 begins to collapse (as shown in FIG. 1), resulting in translation of upper plate 24 toward the registration corner. Lower plate 22 follows this motion, and so does workpiece 12, of course, until workpiece 12 makes contact with the first registration point 16. Here lower and upper plates 22, 24 begin to slide relative to each other, because upper plate 24 continues to translate along the longitudinal axes of bars 38, 42 while lower plate 22 has stopped moving in one axis. Because the magnetic force tending to align the plates is generally at 45 degrees toward the registration corner, workpiece 12 slides relative to the engaged registration pin 16 toward the corner until the second and third pins are encountered. In general, downward motion of upper block 44 continues beyond this point: that is, enough lateral motion has been provided by linkage 28 so that some of it must be lost in further relative displacement between the plates. If this were not the case, registration might not be achieved, because motion of workpiece 12 might have stopped short of engagement with the third pin.

An advantage of the invention is the ability, with essentially no wearing parts, to register various sizes of workpieces onto virtually any flat work surface, eliminating the need for special mechanisms in the workholders of the various hybrid circuit production machines.

OTHER EMBODIMENTS

Other embodiments of the inventions are within the scope of the following claims. For example, in addition to permanent magnets 26, electromagnets can be used, and other means can be used to provide sliding in three degrees between the plates (for example, ball bearings). Also, in place of the magnets and the air cushion, springs can be used to provide both the resilience in three degrees and the attraction of the two plates toward each other in a particular orientation. Also, instead of having all north poles on one plate face one direction and be opposed by all south poles of magnets on the other plate, two of the magnets on one plate could have their north poles facing the other plate, and two could have their south poles facing the other plate, to adjust the stiffness of the resilient attraction. Also, by incorporating ferromagnetic materials (e.g., soft iron) in the flux path, one can adjust the relative stiffness in each of the three axes, as well as the ratio of total vertical attraction force to resilience in the horizontal plane. Other flat workpieces such as printed circuit boards, glass, or sheet metal can be registered with the apparatus. Also, the compliant linkage could be used in other apparatus besides a flat workpiece registration device; it can be used, for example, to load integrated circuits onto a board, the pins of the integrated circuit chips being directed to holes having guidance surfaces leading to them.

Also, plural workpieces could be registered simultaneously with plural registration corners by providing plural lower plates and workpiece holders sliding relative to and attracted to different portions of a single upper plate.

What is claimed is:

1. Compliant linkage apparatus for providing, in a single stage, three degrees of freedom in a single plane, said apparatus comprising
    an upper plate,
    a lower plate under the upper plate,
    sliding means for allowing said upper and lower plates to slide relative to each other laterally along orthogonal axes and rotationally,
    orientation means for causing said plates to attract each other in a particular orientation to resiliently resist relative lateral and rotational displacements of said plates,
    means for displacing connected to one said plate, and
    means for engaging an object connected to the other said plate,
    whereby a compliant linkage is provided between said means for displacing and said means for engaging.

2. The apparatus of claim 1 wherein said orientation means employs magnetism to cause said plates to attract each other.

3. The apparatus of claim 2 wherein said plates are made of nonferrous material, and said attracting means comprises plural discrete magnets at corresponding locations on opposing surfaces of said upper and lower plates.

4. The apparatus of claim 3 wherein there are four pairs of said magnets.

5. The apparatus of claim 3 wherein said magnets are permanent magnets.

6. The apparatus of claim 3 wherein said magnets are electromagnets.

7. The apparatus of claim 1 wherein said sliding means comprises means to supply compressed air into the interface of said plates through one or more orifices.

8. The apparatus of claim 1 wherein said sliding means includes ball bearings.

9. The apparatus of claim 1 wherein said orientation means is provided by resilient springs connected between said plates.

10. Apparatus for the mechanical registration of a flat workpiece on a flat work surface carrying means defining a registration corner for receiving a corresponding corner of said workpiece, said apparatus comprising displacement means supported above said work surface for providing displacement in a direction toward said corner, an upper plate connected to said displacement means, a lower plate under the upper plate, sliding means for allowing said upper and lower plates to slide relative to each other laterally along orthogonal axes and rotationally, orientation means for causing said plates to attract each other in a particular orientation to resiliently resist relative lateral and rotational displacements of said plates, a workpiece holder connected to said lower plate for engaging said workpiece under said lower plate and above said work surface, said displacement means causing displacement of said upper plate, lower plate, workpiece holder and workpiece toward said corner, said sliding means and orientation means permitting three degrees of freedom of resilient movement of said workpiece with respect to said displacement means after initial contact of said workpiece with said means defining a registration corner, permitting registration with said registration corner.

11. The apparatus of claim 10 wherein said orientation means employs magnetism to cause said plates to attract each other.

12. The apparatus of claim 11 wherein said plates are made of nonferrous material, and said attracting means comprises plural discrete magnets at corresponding locations on opposing surfaces of said upper and lower plates.

13. The apparatus of claim 12 wherein there are four pairs of said magnets.

14. The apparatus of claim 12 wherein said magnets are permanent magnets.

15. The apparatus of claim 12 wherein said magnets are electromagnets.

16. The apparatus of claim 10 wherein said workpiece holder employs vacuum engagement.

17. The apparatus of claim 10 wherein said displacement means includes means for converting motion in a direction transverse to said work surface to said direction toward said corner.

18. The apparatus of claim 17 wherein said displacement means includes a parallelogram linkage.

19. The apparatus of claim 10 wherein said work surface carries a plurality of means defining registration corners, and further comprising multiple lower plates and one large upper plate, each lower plate being equipped with a workpiece holder to carry a single workpiece independent of the others, so that multiple workpieces may be registered simultaneously.

20. The apparatus of claim 10 wherein said sliding means includes ball bearings.

21. The apparatus of claim 10 wherein said orientation means is provided by resilient springs connected between said plates.

* * * * *